United States Patent
Wei et al.

(10) Patent No.: US 10,618,082 B2
(45) Date of Patent: Apr. 14, 2020

(54) METHOD FOR CLEANING BONDING INTERFACE BEFORE BONDING

(71) Applicant: Shanghai Simgui Technology Co., Ltd., Shanghai (CN)

(72) Inventors: Xing Wei, Shanghai (CN); Meng Chen, Shanghai (CN); Yongwei Chang, Shanghai (CN); Guoxing Chen, Shanghai (CN)

(73) Assignee: Shanghai Simgui Technology Co., Ltd., Shanghai (CN)

(*) Notice: Subject to any disclaimer, the term of this patent is extended or adjusted under 35 U.S.C. 154(b) by 272 days.

(21) Appl. No.: 15/905,339

(22) Filed: Feb. 26, 2018

(65) Prior Publication Data

US 2018/0178257 A1 Jun. 28, 2018

(30) Foreign Application Priority Data

Dec. 27, 2016 (CN) .......................... 2016 1 1226886

(51) Int. Cl.
| | |
|---|---|
| *B08B 3/08* | (2006.01) |
| *H01L 21/02* | (2006.01) |
| *H01L 21/762* | (2006.01) |
| *C11D 11/00* | (2006.01) |
| *C11D 7/06* | (2006.01) |
| *H01L 21/20* | (2006.01) |
| *B08B 3/10* | (2006.01) |
| *H01L 29/161* | (2006.01) |
| *H01L 29/16* | (2006.01) |
| *H01L 29/20* | (2006.01) |

(52) U.S. Cl.
CPC .................. *B08B 3/08* (2013.01); *C11D 7/06* (2013.01); *C11D 11/0047* (2013.01); *H01L 21/02052* (2013.01); *H01L 21/2007* (2013.01); *H01L 21/76251* (2013.01); *B08B 3/10* (2013.01); *B08B 2203/007* (2013.01); *H01L 29/16* (2013.01); *H01L 29/161* (2013.01); *H01L 29/1608* (2013.01); *H01L 29/20* (2013.01); *H01L 29/2003* (2013.01)

(58) Field of Classification Search
None
See application file for complete search history.

(56) References Cited

FOREIGN PATENT DOCUMENTS

CN 1996551 A * 7/2007

OTHER PUBLICATIONS

EPO translation of CN1996551, retrieved on Jan. 17, 2020 (Year: 2020).*

* cited by examiner

*Primary Examiner* — Eric W Golightly
(74) *Attorney, Agent, or Firm* — Arch & Lake LLP

(57) ABSTRACT

The present disclosure provides a method for cleaning a bonding interface before bonding. The method includes: providing a first surface and a second surface for bonding, the first surface being a non-crystal surface and the second surface being a crystal surface; and cleaning the first surface and the second surface with ammonia respectively before bonding, wherein at least one of parameters of an ammonia concentration and a cleaning temperature for cleaning the first surface is higher than a counterpart of parameters for cleaning the second surface.

6 Claims, 2 Drawing Sheets

---

S20: Provide a first surface and a second surface for bonding

↓

S21: Clean the first surface with ammonia before bonding

↓

S22: Clean the second surface with ammonia before bonding

METHOD FOR CLEANING BONDING INTERFACE BEFORE BONDING

The present application is based on and claims the priority to Chinese patent application No. CN201611226886.7, filed on Dec. 27, 2016, which is incorporated by reference herein in its entirety.

TECHNICAL FIELD

The present disclosure relates to the field of semiconductor material manufacturing, and in particular, relates to a method for cleaning a bonding interface before bonding.

BACKGROUND

Bonding is a commonly used technique in the semiconductor process. Whether the bonding interface is in well contact is an important indicator for measuring bonding quality. In the prior art, after two substrates are bonded, a region where bonding contact is poor may sometimes be found on an opposite side of the opening of the substrate. FIG. 1 is a schematic diagram of a defective region generated on a bonding interface in the prior art. As illustrated in FIG. 1, poor contact in the bonding interface may be found in the bonding region opposite to an opening 11 of a substrate 10. How to avoid poor contact in this region is a problem to be urgently solved in the prior art.

SUMMARY

The technical problem to be solved by the present disclosure is to provide a bonding method that is capable of improving quality of a bonding interface.

To solve the above technical problem, the present disclosure provides a method for cleaning a bonding interface before bonding. The method includes: providing a first surface and a second surface for bonding, the first surface being an amorphous surface and the second surface being a crystal surface; and cleaning the first surface and the second surface with ammonia respectively before bonding, wherein at least one of parameters of an ammonia concentration and a cleaning temperature for cleaning the first surface is higher than a counterpart of parameters for cleaning the second surface.

Optionally, the ammonia is a buffer solution containing hydrogen peroxide.

Optionally, the first surface is made from an oxide.

Optionally, the second surface is made from a semiconductor material.

Optionally, the first surface is made from any one of silicon oxide, silicon nitride, and silicon oxynitride.

Optionally, the second surface is made from any one of silicon crystalline, germanium-silicon crystalline, silicon carbide crystalline, gallium nitride crystalline, and gallium arsenide crystalline.

Optionally, the second surface is made from a semiconductor whose surface is coated with an amorphous thin film, the amorphous thin film having a thickness of less than 50 nm.

Optionally, the amorphous thin film is made from any one of silicon oxide, silicon nitride, and silicon oxynitride.

According to the present disclosure, by means of the method where at least one of parameters of an ammonia concentration and a cleaning temperature for cleaning the first surface is higher than a counterpart of parameters for cleaning the second surface, the bonding activity of the crystal surface is reduced, and thus the propagation speed of the bonding wave is lower, thereby facilitating close contact between the bonding interfaces.

DETAILED DESCRIPTION

Specific practice of a method for cleaning a bonding interface before bonding according to the present disclosure is described in detail with reference to the accompanying drawings.

Figure 1:
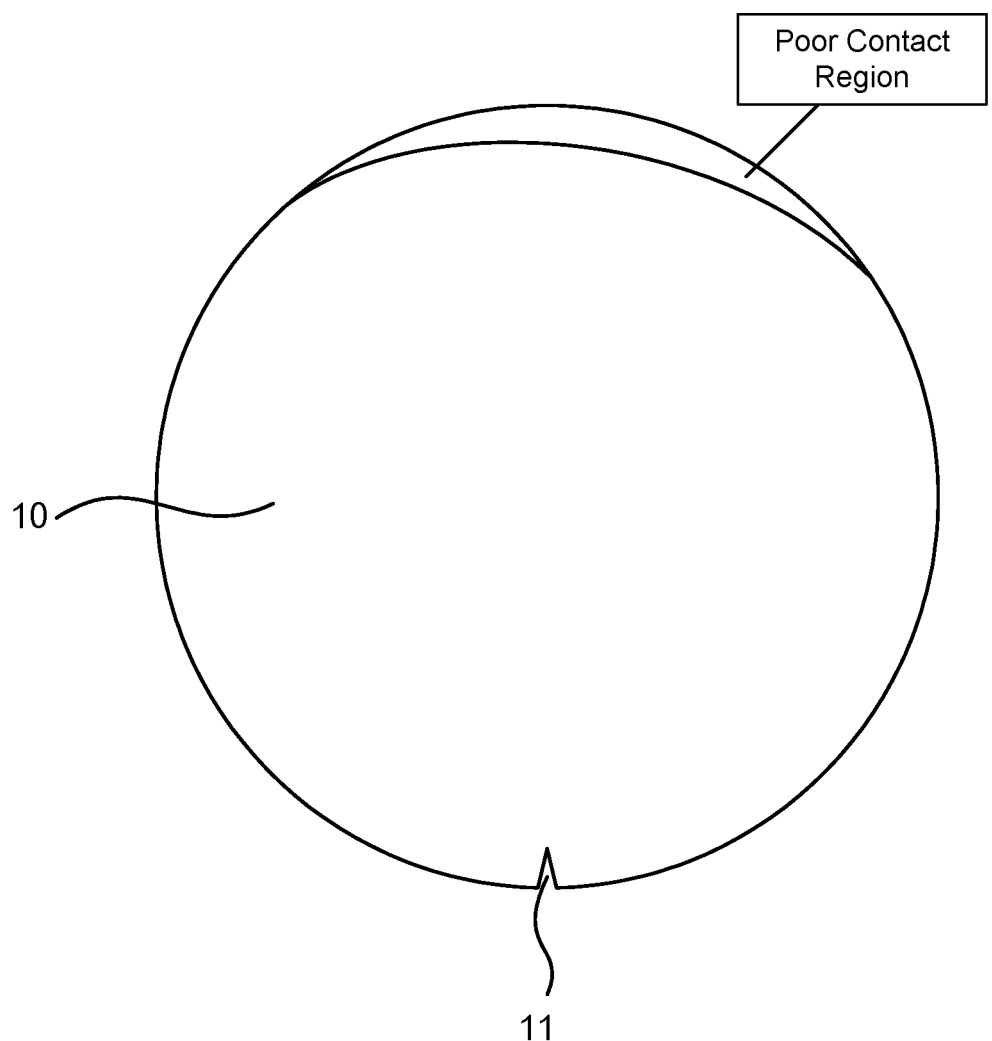
FIG. 1 is a schematic diagram of a defective region generated on a bonding interface in the prior art.
Figure 2:
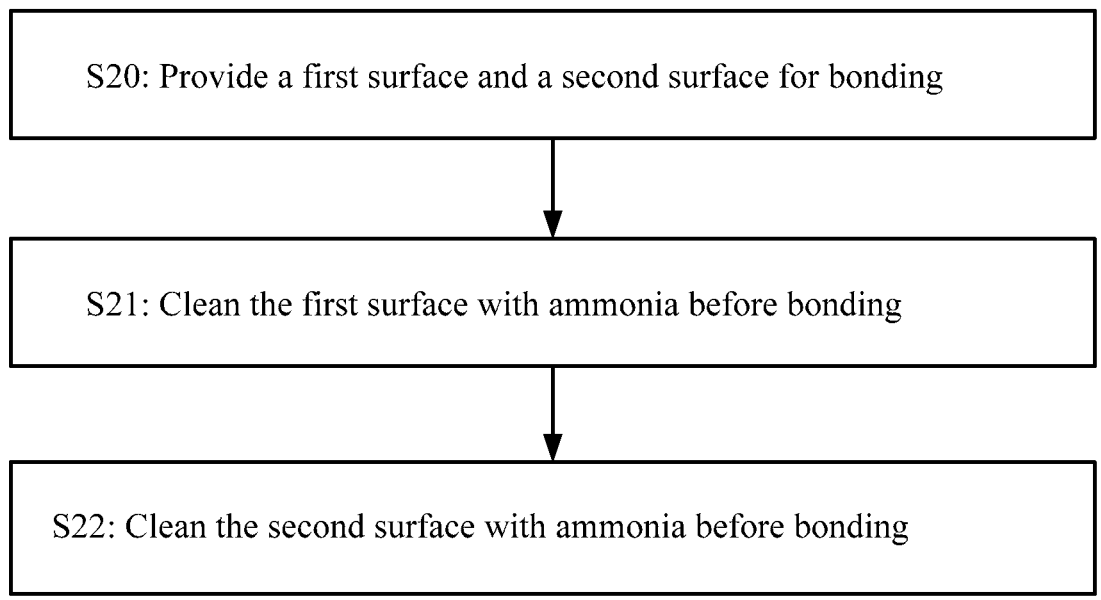
FIG. 2 is a schematic diagram of steps of a method for cleaning a bonding interface before bonding according to a specific embodiment of the present disclosure.

FIG. 2 is a schematic diagram of steps of the method according to a specific embodiment. The method includes: step S20 providing a first surface and a second surface for bonding; step S21 cleaning the first surface with ammonia before bonding; and step S22 cleaning the second surface with ammonia before bonding.

In step S20, a first surface and a second surface for bonding are provided. The first surface is an amorphous surface, and the second surface is a crystal surface.

As a specific embodiment, the first surface is made from an oxide material, and the second surface is made from a semiconductor material. In this specific embodiment, the first surface may be an oxidation layer formed on a surface of a supporting substrate. The supporting substrate is made from any one of silicon crystalline, germanium-silicon crystalline, silicon carbide crystalline, gallium nitride crystalline, and gallium arsenide crystalline; or may be a sapphire substrate or a metal substrate or the like. The first surface is made from any one of silicon oxide, silicon nitride, and silicon oxynitride. For example, the supporting substrate may also be a silicon oxide layer on the surface of a monocrystalline silicon substrate, and the first surface is the surface of the silicon oxide layer. The second surface may be a surface of a semiconductor substrate. The semiconductor substrate is made from any one of silicon crystalline, germanium-silicon crystalline, silicon carbide crystalline, gallium nitride crystalline, and gallium arsenide crystalline. For example, the semiconductor substrate may be a monocrystalline substrate, and the second surface is a surface of the substrate.

As a specific embodiment, the second surface may also be made from a semiconductor material whose surface is coated with an amorphous thin film, wherein the amorphous thin film has a thickness of less than 50 nm. The amorphous thin film is made from any one of silicon oxide, silicon nitride, and silicon oxynitride. The semiconductor material is selected from any one of silicon crystalline, germanium-silicon crystalline, silicon carbide crystalline, gallium nitride crystalline, and gallium arsenide crystalline. For example, the second surface may be monocrystalline silicon covering a silicon oxide layer having a thickness of less than 50 nm. Since the amorphous thin film has a very small thickness, the surface may exhibit properties of the semiconductor material during bonding.

In step S21, the first surface is cleaned with ammonia before bonding. Before bonding, the first surface needs to be cleaned to remove impurities thereon. The first surface may be cleaned using RCA standard cleaning or another similar cleaning method. To remove metal contaminates or organic contaminates, the employed cleaning method should involve a step of cleaning with ammonia. In this specific embodiment, the cleaning liquid this step is preferably an ammonia buffer solution, that is, a solution formulated by $NH_4OH$, $H_2O_2$ and $H_2O$ based on a specific proportion. The proportion may be within the range of 1:1:5 to 1:2:7. The cleaning may be practiced within a temperature range of 50° C. to 80° C. according to the actual needs.

In step S22, the second surface is cleaned with ammonia before bonding. Before bonding, the second surface needs to be cleaned to remove impurities thereon. The second surface may be cleaned using RCA standard cleaning or another similar cleaning method. To remove metal contaminates or organic contaminates, the employed cleaning method should involve a step of cleaning with ammonia. In this specific embodiment, the cleaning liquid this step is preferably an ammonia buffer solution, that is, a solution formulated by $NH_4OH$, $H_2O_2$ and $H_2O$ based on a specific proportion. The proportion may be within the range of 1:1:5 to 1:2:7. The cleaning may be practiced within a temperature range of 50° C. to 80° C. according to the actual needs. In this step, the concentration of ammonia in the cleaning liquid is the concentration of $NH_4OH$ in the solution, and should be less than that in step S21; or the temperature in cleaning is lower than that in step S21. Optionally, the above two conditions may also be both satisfied. That is, the concentration of $NH_4OH$ in the solution is less than that in step S21 and the temperature in cleaning is lower than that in step S21. In addition, preferably, the concentration of $NH_4OH$ in the solution is less than that in step S21 because the practice shows that variation of the concentration of ammonia achieves an effect superior over the effect achieved by a temperature variation. For example, in the condition of $NH_4OH:H_2O_2=1:2$, the first surface is cleaned at the temperature of 70° C. and the second surface is cleaned at the temperature of 50° C.; and if the first surface and the second surface are both cleaned at the temperature of 70° C., the first surface is cleaned with a cleaning liquid with $NH_4OH:H_2O_2=3:4$, and the second surface is cleaned with a cleaning liquid with $NH_4OH:H_2O_2=1:2$. Optionally, the first surface is cleaned at the temperature of 50° C., the second surface is cleaned at the temperature of 70° C., the first surface is cleaned with a cleaning solution with $H_4OH:H_2O_2=3:4$, and the second surface is cleaned with a cleaning liquid with $NH_4OH:H_2O_2=1:2$.

The above two surfaces may be used for bonding. A forming mechanism of the bonding interface signifies that the bonding wave is propagated along the bonding interface such that two bonding interfaces are closely contacted during the bonding process. With respect to a semiconductor substrate having an opening, the bonding wave is firstly formed at the opening and then diffused outside along the opening. With respect to a bonding interface in another shape with no opening, the bonding wave may also be formed by means of randomly selecting one or several points, and then diffused outside. A low diffusion speed of the bonding wave is favorable to close contact between the bonding interfaces. The diffusion speed of the bonding wave is determined by the bonding activity of the surfaces, and the bonding activity on a crystal surface is higher than that on an amorphous surface. The surface of the semiconductor material coated with an amorphous thin film may exhibit properties of the semiconductor material during bonding, that is, properties of the crystal. With respect to bonding between the amorphous surface and the crystal surface, the bonding speed of the surfaces is mainly determined by the crystal surface having a higher bonding activity. Experiments reveal that washing with ammonia is favorable to improving the bonding activity of the surface, and a higher concentration achieves a higher cleaning effect and a higher cleaning temperature achieves a more remarkable activation effect. Therefore, in this specific embodiment, by means of the method where at least one of parameters of an ammonia concentration and a cleaning temperature for cleaning the first surface is higher than a counterpart of parameters for cleaning the second surface, the bonding activity of the crystal surface is reduced, and thus the propagation speed of the bonding wave is lower, thereby facilitating close contact between the bonding interfaces.

Described above are preferred examples of the present disclosure. It should be noted that persons of ordinary skill in the art may derive other improvements or polishments without departing from the principles of the present disclosure. Such improvements and polishments shall be deemed as falling within the protection scope of the present disclosure.

What is claimed is:

1. A method for cleaning a bonding interface before bonding, comprising:
   providing a first surface and a second surface for bonding, the first surface being an amorphous surface and the second surface being a crystal surface, wherein the second surface is made from a semiconductor material whose surface is coated with an amorphous thin film, the amorphous thin film having a thickness of less than 50 nm; and
   cleaning the first surface and the second surface with ammonia respectively before bonding, wherein at least one of parameters of an ammonia concentration and a cleaning temperature for cleaning the first surface is higher than a counterpart of parameters for cleaning the second surface.

2. The method for cleaning a bonding interface before bonding according to claim 1, wherein the ammonia is a buffer solution containing hydrogen peroxide.

3. The method for cleaning a bonding interface before bonding according to claim 1, wherein the first surface is made from an oxide material.

4. The method for cleaning a bonding interface before bonding according to claim 1, wherein the first surface is made from any one of silicon oxide, silicon nitride, and silicon oxynitride.

5. The method for cleaning a bonding interface before bonding according to claim 1, wherein the second surface is made from any one of silicon crystalline, germanium-silicon crystalline, silicon carbide crystalline, gallium nitride crystalline, and gallium arsenide crystalline.

6. The method for cleaning a bonding interface before bonding according to claim 1, wherein the amorphous thin film is made from any one of silicon oxide, silicon nitride, and silicon oxynitride.

* * * * *